(12) United States Patent
Wu et al.

(10) Patent No.: US 8,150,638 B1
(45) Date of Patent: Apr. 3, 2012

(54) PREDICTING PARASITIC CAPACITANCE IN SCHEMATIC CIRCUIT SIMULATIONS USING SUB-CIRCUIT MODELING

(75) Inventors: Shuxian Wu, San Jose, CA (US); Tao Yu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 617 days.

(21) Appl. No.: 12/197,921

(22) Filed: Aug. 25, 2008

(51) Int. Cl.
*G06F 17/10* (2006.01)
*G06F 17/50* (2006.01)
(52) U.S. Cl. .............................. 702/57; 703/2; 716/115
(58) Field of Classification Search .................... 702/57, 702/117
See application file for complete search history.

(56) References Cited

U.S. PATENT DOCUMENTS

| | | | | |
|---|---|---|---|---|
| 5,773,317 | A | * | 6/1998 | Wu et al. .......................... 438/17 |
| 6,883,148 | B1 | * | 4/2005 | Teig et al. .......................... 716/4 |
| 7,260,797 | B2 | * | 8/2007 | Batterywala et al. ............. 716/5 |

OTHER PUBLICATIONS

Mueller, Judith et al., Modeling of MOSFET parasitic capacitances, and their impact on circuit performance, Elsevier Ltd., Solid-State Electronics 51, 1997, p. 1485-1493.*
Lin, Wallece et al., On the Measurement of Parasitic Capacitances of Device with More than Two External Terminals using LCR Meter, IEEE Transactions on Electron Devices vol. 38 No. 11, 1991, p. 2573-2575.*
Johnson et al., Applied multivariate statistical analysis, Prentice-Hall, 2002, Chapter 3—p. 1.*
Kumagai et al., A 3D Analysis of Source/Drain Capacitance in SOI MOSFET for Practical Circuit Design, 1994, IEEE International SOI Conference, pp. 15-16.*
Kumagai et al., A 3D Analysis of Source/Drain Capacitance in SOI MOSFET for Practical Circuit Design, 1994, IEEE International SOI Conference, pp. 15-16.*
Crawford, Jonathan F., "Supplementary users guide to Fastcap (and FFTCAP) with Unix hints," Jul. 1999, pp. 1-5, available from Research Laboratory of Electronics, Massachusetts Institute of Technology, Room 36-413, 77 Massachusetts Avenue, Cambridge, Massachusetts 02139, USA.
Ansoft Corp., "Q3D Extractor v8" datasheet, copyright 2008, pp. 1-2, available from Ansoft Corporation, 225 West Station Square Drive, Suite 200, Pittsburgh, Pennsylvania 15219, USA.
Synopsys, Inc., "Raphael Interconnect Analysis Tool" data sheet, copyright 2006, available from Synopsys, Inc., 700 E. Middlefield Road, Mt. View, California 94043, USA.

* cited by examiner

*Primary Examiner* — Sujoy Kundu
*Assistant Examiner* — Michael Dalbo
(74) *Attorney, Agent, or Firm* — Kevin T. Cuenot; LeRoy D. Maunu

(57) ABSTRACT

A computer-implemented method of determining parasitic capacitance for transistors within an integrated circuit can include determining a first set of coefficients for a first expression that calculates parasitic capacitance for a transistor structure according to a first plurality of parasitic capacitances derived from a plurality of two-dimensional transistor structures (320). The first set of coefficients can be inserted into the first expression (325). The method further can include determining a second set of coefficients for a second expression that calculates parasitic capacitance for a transistor structure according to a second plurality of parasitic capacitances derived from a plurality of three-dimensional transistor structures (345). The second expression can include the first expression (350). The method can include inserting the second set of coefficients into the second expression and outputting the second expression (355).

17 Claims, 3 Drawing Sheets

US 8,150,638 B1

PREDICTING PARASITIC CAPACITANCE IN SCHEMATIC CIRCUIT SIMULATIONS USING SUB-CIRCUIT MODELING

FIELD OF THE INVENTION

The embodiments disclosed herein relate to integrated circuit devices (ICs). More particularly, the embodiments relate to determining parasitic capacitances in schematic circuit simulations for an IC.

BACKGROUND OF THE INVENTION

Simulation is invaluable when creating circuit designs for implementation within integrated circuits (ICs). Often, circuit designs are simulated at the schematic level. That is, circuit designs can be simulated prior to layout of the circuit design. This means that the circuit can be simulated with respect to functionality, timing, and other aspects purely from the schematic of the circuit design prior to determining where the various components of the circuit design will be located on the target IC.

As IC fabrication technology continues to improve and circuit components become smaller, parasitic effects once considered minor become more significant, particularly when estimating circuit performance during simulation. The role of these parasitic effects can be observed through a comparison of pre-layout simulation results, referred to as schematic simulation, of a circuit with post-layout simulation results of the same circuit. Post layout simulation of a circuit may show a decrease in circuit performance, as compared to schematic simulation, of approximately 20 percent for the same circuit. In some cases, the divergence grows to approximately 50 percent.

This difference in simulation results between schematic simulation and post-layout simulation makes predicting circuit performance at early stages of circuit design very difficult. It often becomes necessary to continually re-optimize a circuit at later stages of development to recover this loss in performance once the layout process begins. Re-optimization, however, can lengthen the design cycle of the circuit and add significant cost to the process.

SUMMARY OF THE INVENTION

The embodiments disclosed herein relate to determining Inposelstartparasitic capacitancelnposelends of transistors in schematic circuit simulations for an integrated circuit (IC). One embodiment of the present invention can include a computer-implemented method of determining parasitic capacitance for transistors within an IC including determining a first set of coefficients for a first expression that calculates parasitic capacitance for a transistor structure according to a first plurality of parasitic capacitances derived from a plurality of two-dimensional transistor structures. The first set of coefficients can be inserted into the first expression.

The method also can include determining a second set of coefficients for a second expression that calculates parasitic capacitance for a transistor structure according to a second plurality of parasitic capacitances derived from a plurality of three-dimensional transistor structures. The second expression can include the first expression. The second set of coefficients can be inserted into the second expression. The method can include outputting the second expression.

The parasitic capacitance can be selected to be gate-to-source capacitance and/or gate-to-drain capacitance. In another aspect, the parasitic capacitance can be selected to be source-to-drain capacitance. In another aspect, the parasitic capacitance can be selected to be source metallization layer to neighboring metallization layer capacitance and/or drain metallization layer to neighboring metallization layer capacitance.

The first expression can be selected to depend upon transistor channel length of each of the plurality of two-dimensional transistor structures. For example, the first expression can be selected to be $C2D_i = A2_i + B2_i/L + C2_i/(L^2)$, wherein $C2D_i$ represents a two-dimensional parasitic capacitance, wherein $A2_i$, $B2_i$, and $C2_i$ are fitting coefficients determined by fitting a line to the first plurality of parasitic capacitances, and L represents transistor channel length of the plurality of two-dimensional transistor structures.

The second expression can be selected to depend upon a number of contacts of each of the plurality of three-dimensional transistor structures. In another aspect, the second expression can be selected to depend upon transistor channel width of each of the plurality of three-dimensional transistor structures. In still another aspect, the second expression can be selected to depend upon transistor channel length of each of the plurality of three-dimensional transistor structures and/or nominal length of each of the plurality of three-dimensional transistor structures.

For example, the second expression can be selected to be $C3D_i = [A3_i*(D3_i*W + E3_i) + B3_i*NumCo]*C2D_i(L)/C2D_i(Lnom)$, wherein $C3D_i$ represents a three-dimensional parasitic capacitance, wherein $A3_i$, $B3_i$, $C3_i$, $D3_i$, and $E3_i$ are fitting coefficients determined by fitting a line to the second plurality of parasitic capacitances, wherein L represents transistor channel length of the plurality of three-dimensional transistor structures, Lnom represents nominal channel length of the plurality of three-dimensional transistor structures, and W represents transistor channel width of the plurality of three-dimensional transistor structures.

In the case where the second expression depends upon a number of contacts, the method can include calculating a parasitic capacitance for a selected transistor structure having a specified number of contacts using the second expression.

Another embodiment of the present invention can include a computer-implemented method of determining parasitic capacitance for a transistor structure within an IC including storing a first expression that determines parasitic capacitance for transistor structures, wherein the first expression depends upon transistor channel length, and storing a second expression that determines parasitic capacitance for transistor structures. The second expression can include the first expression and can depend upon number of contacts of the transistor structures. The method can include receiving an input specifying a number of contacts for transistor structures used within a circuit design and calculating a value of parasitic capacitance for transistor structures using the second expression. The value of parasitic capacitance can be output.

The first expression can be selected to include a first plurality of coefficients determined from a plurality of parasitic capacitances derived from a plurality of two-dimensional transistor structures. The second expression can be selected to include a second plurality of coefficients determined from a second plurality of parasitic capacitances derived from a plurality of three-dimensional transistor structures.

For example, the first expression can be defined as $C2D_i = A2_i + B2_i/L + C2_i/(L^2)$, wherein $C2D_i$ represents a two-dimensional parasitic capacitance, wherein $A2_i$, $B2_i$, and $C2_i$ are fitting coefficients determined by fitting a first line to a first plurality of parasitic capacitances generated from a plurality of two-dimensional transistor structures, and L represents transistor channel length of the plurality of two-dimensional transistor structures. The second expression can be defined as $C3D_i=[A3_i*(D3_i*W+E3_i)+B3_i*NumCo]*C2D_i(L)/C2D_i(Lnom)$, wherein C3D, represents a three-dimensional parasitic capacitance, wherein $A3_i$, $B3_i$, $C3_i$, $D3_i$, and $E3_i$ are fitting coefficients determined by fitting a second line to a second plurality of parasitic capacitances generated from a plurality of three-dimensional transistor structures, wherein L represents transistor channel length of the plurality of three-dimensional transistor structures, Lnom represents nominal channel length of the plurality of three-dimensional transistor structures, and W represents transistor channel width of the plurality of three-dimensional transistor structures.

Yet another embodiment of the present invention can include a computer program product including a computer-usable medium having computer-usable program code that, when executed by a data processing system, causes the data processing system to perform the various steps and/or functions disclosed herein.

DETAILED DESCRIPTION

Figure 1:
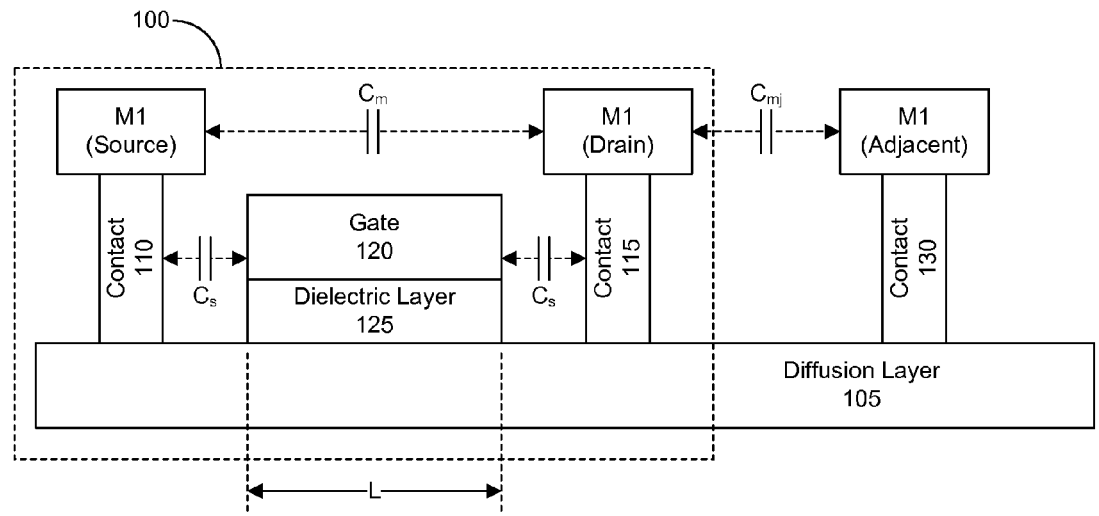
FIG. 1 is a block diagram illustrating a transistor structure in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to determining parasitic capacitances of a transistor that can be utilized when simulating a circuit design for an integrated circuit (IC) prior to layout. The phrase "parasitic capacitance," as used herein, can refer to different types of parasitic capacitances such as, for example, gate-to-contact capacitances of a transistor structure, contact-to-contact capacitance of the transistor structure, and contact-to-contact capacitance between two or more different transistor structures. Different types of parasitic capacitance will be described in greater detail within this specification.

An IC can include any of a variety of non-programmable, fully programmable, or partially programmable ICs, custom ICs such as application specific ICs (ASICs), mixed signal ICs, or the like. In terms of programmable and/or partially programmable ICs, an IC can refer to a Field Programmable Gate Array (FPGA), a Complex Programmable Logic Device (CPLD), Programmable Logic Arrays (PLAs), Programmable Array Logic (PAL) devices, mask programmable ICs where the device is programmed by applying a processing layer, e.g., a metal layer, that programmably interconnects elements on the IC, ICs using fuse or antifuse technology, and/or ICs that may include a combination of hard-coded transistor logic and a programmable switch fabric that programmably interconnects the hard-coded transistor logic.

In accordance with the embodiments disclosed herein, accurate estimates of parasitic capacitance for a transistor structure can be determined while the circuit is still in schematic form, e.g., pre-layout. By accurately estimating parasitic capacitances of the transistor while the circuit design is in schematic form, a more accurate estimate of the performance of the circuit design, e.g., in terms of timing, power consumption, or the like, can be determined. The simulation results will not significantly degrade after a layout of the circuit is performed for a selected target IC. By achieving more accurate circuit performance estimates during schematic simulation early in the design process, the need for costly and time consuming circuit re-design after layout is reduced, if not entirely eliminated.

In accordance with the embodiments disclosed herein, a first set of parasitic capacitance data can be generated from a plurality of two-dimensional (2D) transistor structures. An expression that calculates parasitic capacitance can be determined from the first set of parasitic capacitance data. A second set of parasitic capacitance data can be generated from a plurality of three-dimensional (3D) transistor structures. A second expression that calculates parasitic capacitance can be determined according to the second set of parasitic capacitance data. The second expression can depend upon, or include, the first expression. The second expression can be output as a model that may be used to calculate one or more different types of parasitic capacitance for transistors. In one embodiment, the model that is output can be implemented in the form of a SUBCKT (sub-circuit) as is commonly used within the Simulation Program with Integrated Circuit Emphasis (SPICE) domain and recognized by SPICE circuit simulators, e.g., a single device SPICE model. The parasitic capacitance values can be used within a schematic simulation of the circuit design.

FIG. 1 is a block diagram illustrating a transistor structure 100 in accordance with one embodiment of the present invention. The block diagram pictured in FIG. 1 is a 2D illustration of transistor structure 100. Transistor structure 100 can include a diffusion layer 105. As shown, traces within a metallization layer, denoted as M1, can be coupled to the diffusion layer 105 via contacts 110 and 115. The source of transistor 100 can be formed with M1 source being coupled to the diffusion layer 105 via contact 110. The drain of transistor structure 100 can be formed with M1 drain being coupled to the diffusion layer 105 via contact 115. Gate 120 of transistor structure 100 can be a polysilicon layer disposed atop of a dielectric layer 125. As shown, the dielectric layer 125 can be disposed immediately above the diffusion layer 105, e.g., between the diffusion layer 105 and the gate 120. The gate 120 can have a length denoted as L. In the example pictured in FIG. 1, L refers to the transistor channel length of transistor structure 100.

FIG. 1 illustrates different types of parasitic capacitance that exist among the various elements of transistor structure 100. More particularly, FIG. 1 illustrates the different types of parasitic capacitance denoted as $C_s$, $C_m$, and $C_{mj}$. Parasitic capacitance $C_s$ represents the capacitance that exists between gate 120 and each of contacts 110 and 115, referred to as gate-to-source and/or gate-to-drain capacitance. The parasitic capacitance $C_s$ is dependent upon the spacing, e.g., the distance, between gate 120 and contact 110 as well as the spacing between gate 120 and contact 115. Typically, the smaller the distance between gate 120 and contact 110 or contact 115, the larger the capacitance value of $C_s$.

Parasitic capacitance $C_m$ represents the capacitance between M1 source and M1 drain of transistor structure 100. Parasitic capacitance $C_m$ may also be referred to as the source to drain capacitance. As the distance between M1 source and M1 drain decreases, the value of $C_m$ will typically increase. Parasitic capacitance $C_{mj}$ represents the capacitance that exists between M1 source or M1 drain of transistor structure 100 and the next adjacent M1 source or M1 drain of a neighboring transistor structure. For example, an adjacent source or drain, denoted as M1 adjacent in FIG. 1, can be part of a transistor structure that neighbors, or is adjacent to, transistor structure 100. The M1 adjacent layer is coupled to the diffusion layer 105 via contact 130. The parasitic capacitance $C_{mj}$ exists between M1 drain and M1 adjacent with the value of $C_{mj}$ typically increasing as the distance between M1 drain and M1 adjacent decreases. It should be appreciated that another transistor structure can be positioned to the left of M1 source with another parasitic capacitance $C_{mj}$ existing between M1 source and the transistor structure (not shown) to the left of transistor structure 100. Parasitic capacitance $C_{mj}$ may also be referred to as the source metallization layer or drain metallization layer to neighboring metalization layer capacitance.

Accordingly, the smaller the transistor structure, the larger the value of parasitic capacitance, whether $C_s$, $C_m$, and/or $C_{mj}$, that is likely to result. Thus, with advances in fabrication technology, the influence of these parasitic capacitances becomes ever more significant in terms of the performance of the transistor structure 100 as well as any circuit that incorporates transistor structure 100. For example, with process technologies less than approximately 130 nm, the effects of $C_s$, $C_m$, and/or $C_{mj}$ become more prominent.

FIG. 1 illustrates a single, 2D transistor structure. One or more additional 2D transistor structures can be created with each 2D transistor structure having a varying, or different, transistor channel length attributes. That is, each different 2D structure can have a different value for L. Other values of the 2D transistor structures, such as spacing of contacts, number of contacts, and the like, can be held constant from one 2D transistor structure to the next.

A field solver tool, e.g., a 2D field solver tool, can be executed on the 2D transistor structures to create a capacitance table. The capacitance table can specify values for each of the different types of parasitic capacitance $C_s$, $C_m$, and $C_{mj}$ discussed above for the different values of transistor channel length. Since the parasitic capacitance values are derived from 2D transistor structures, the parasitic capacitances can be referred to as 2D parasitic capacitances, with each different type of parasitic capacitance being denoted as follows: $C_s$=C2D$_s$, $C_m$=C2D$_m$, and $C_{mj}$=C2D$_{mj}$. The parasitic capacitance table generated from the 2D transistor structures can be referred to as a 2D capacitance table that includes 2D parasitic capacitance data.

Figure 2:
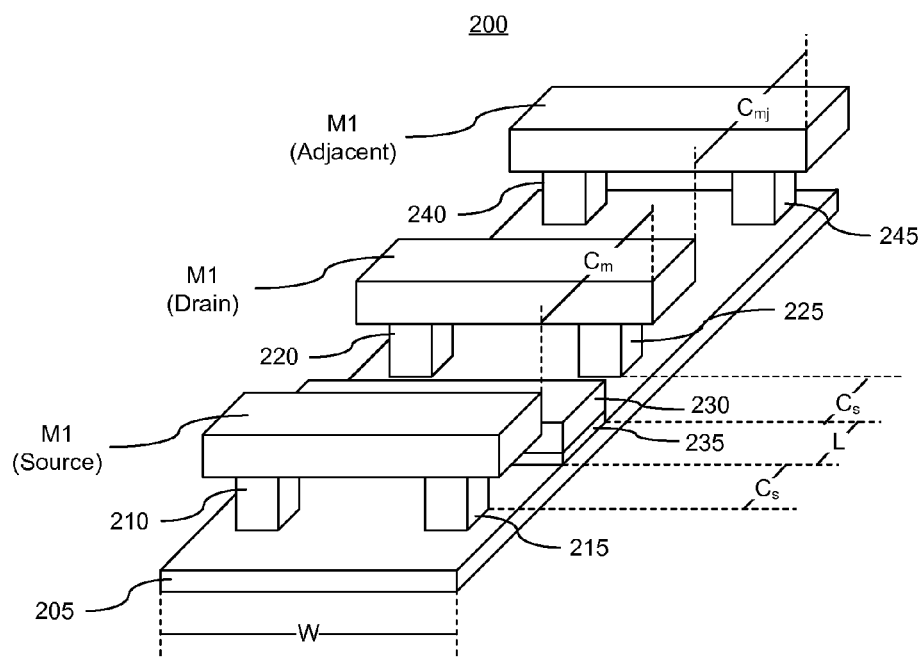
FIG. 2 is a block diagram illustrating a transistor structure in accordance with another embodiment of the present invention.

It should be appreciated that the various transistor structures described herein need not be stored in a graphical manner as illustrated in either FIG. 1 or FIG. 2. For example, each of the different transistor structures can be represented by a collection of values representing the different attributes of the transistor structures, e.g., transistor channel length, number of contacts, or the like.

A line can be fit to the 2D parasitic capacitance data for each different type parasitic capacitance. In one embodiment, the line that is fit to the 2D parasitic capacitance data for each different type of parasitic capacitance can be defined by the following expression: C2D$_i$=A2$_i$+B2$_i$/L+C2$_i$/(L$^2$). Within this expression, denoted as the 2D parasitic capacitance expression or C2D$_i$, i can be set equal to s, m, and/or mj to provide an expression for any of the different types of parasitic capacitances C2D$_s$, C2D$_m$, and C2D$_{mj}$. Within this expression, A2$_i$, B2$_i$, and C2$_i$ are fitting coefficients determined by fitting a line to the 2D parasitic capacitance data for each different parasitic capacitance type. Coefficients A2$_i$, B2$_i$, and C2$_i$ can be referred to as 2D coefficients.

More particularly, for parasitic capacitance $C_s$, coefficients A2$_s$, B2$_s$, and C2$_s$ of C2D$_s$ can be determined by fitting a line specified by C2D$_s$ to the 2D parasitic capacitance data for $C_s$. For parasitic capacitance $C_m$, coefficients A2$_m$, B2$_m$, and C2$_m$ can be determined for C2D$_m$ by fitting a line specified by C2D$_m$ to the 2D parasitic capacitance data for $C_m$. For parasitic capacitance $C_{mj}$, coefficients A2$_{mj}$, B2$_{mj}$, and C2$_{mj}$ can be determined for C2D$_{mj}$ by fitting a line specified by C2D$_{mj}$ to the 2D parasitic capacitance data for $C_{mj}$.

Within the 2D transistor structures, the transistor channel width is not represented and, therefore, goes to infinity. By determining the coefficients of the expression for C2D$_i$ discussed above, a first expression for parasitic capacitance that accounts for the effects of transistor channel length L, and which is not dependent upon transistor channel width, can be determined.

FIG. 2 is a block diagram illustrating a transistor structure 200 in accordance with another embodiment of the present invention. The block diagram pictured in FIG. 2 is a 3D illustration of transistor structure 200. Transistor structure 200 shown in FIG. 2 can include a diffusion layer 205. As shown, traces within a metallization layer, denoted as M1, can be coupled to the diffusion layer 205 via contacts 210, 215, 220, and 225. The source of transistor structure 200 can be formed with M1 source being coupled to diffusion layer 205 via contacts 210 and 215. The drain of transistor structure 200 can be formed with M1 drain being coupled to diffusion layer 205 via contacts 220 and 225. The gate 230 of transistor structure 200 can be a polysilicon layer disposed atop of a dielectric layer 235. As shown, dielectric layer 235 can be disposed immediately above diffusion layer 205. The dielectric layer 235 can be positioned between the diffusion layer 205 and gate 230. The transistor channel length is depicted as L, which corresponds to the length of gate 230. Transistor structure 200 further can have a transistor channel width, denoted as W, which corresponds to the width of gate 230.

FIG. 2 illustrates different types of parasitic capacitance that exist among the various elements of transistor structure 200. FIG. 2 illustrates the different types of parasitic capacitance denoted as $C_s$, $C_m$, and $C_{mj}$. Parasitic capacitance $C_s$ exists between gate 230 and each of the contacts 210, 215, 220 and 225. The parasitic capacitance $C_s$ is dependent upon the spacing, e.g., the distance, between gate 230 and each respective contact 210, 215, 220, and 225. Shorter distances typically result in larger capacitance values for $C_s$. It should be appreciated that the 2D transistor structures included a single contact as width of each transistor structure was not represented. Since the 3D transistor structure 200 does represent transistor channel width, more than one contact may be represented or included for each source and/or drain of transistor structure 200. In the example pictured in FIG. 2, each source and drain includes two contacts. That is, M1 source is coupled to the diffusion layer 205 via contacts 210 and 215. The M1 drain is coupled to the diffusion layer 205 via contacts 220 and 225.

Parasitic capacitance $C_m$ represents the capacitance between M1 source and M1 drain of transistor structure 200. As the distance between M1 source and M1 drain decreases, the value of $C_m$ will typically increase. Parasitic capacitance $C_{mj}$ represents the capacitance that exists between M1 source or M1 drain of transistor 200 and a next adjacent M1 source or M1 drain of a neighboring transistor structure. For example, an adjacent source or drain, denoted as M1 adjacent in FIG. 2, can be part of a transistor structure that neighbors, or is adjacent to, transistor structure 200. The M1 adjacent layer can be coupled to diffusion layer 205 via contacts 240 and 245. The parasitic capacitance $C_{mj}$ exists between M1 drain and M1 adjacent with the value of $C_{mj}$ typically increasing as the distance between M1 drain and M1 adjacent decreases. It should be appreciated that another transistor structure can be situated on the opposite side of transistor structure 200, e.g., adjacent to M1 source, that will create another parasitic capacitance $C_{mj}$ between M1 source and the source or drain of the other transistor structure (not shown).

FIG. 2 illustrates a single, 3D transistor structure. One or more additional 3D transistor structures can be created with each 3D transistor structure having varying, or different, values for transistor channel length, transistor channel width, and/or number of contacts, denoted as NumCo. The number of contacts NumCo, while varying among different 3D transistor structures, can be constant within a single 3D transistor structure. Other attributes, such as spacing of contacts and the like, can be held constant from one 3D transistor structure to the next.

A field solver tool, e.g., a 3D field solver tool, can be executed on the 3D transistor structures to create a capacitance table. The capacitance table can specify values for each of the different types of parasitic capacitance $C_s$, $C_m$, and $C_{mj}$ discussed above for different values of transistor channel length, transistor channel width, and/or number of contacts. Since the parasitic capacitance values are derived from 3D transistor structures, the parasitic capacitances can be referred to as 3D parasitic capacitances, with each parasitic capacitance being denoted as follows: $C_s=C3D_s$, $C_m=C3D_m$, and $C_{mj}=C3D_{mj}$. The parasitic capacitance table generated from the 3D transistor structures can be referred to as a 3D capacitance table that includes 3D parasitic capacitance data.

Using the parasitic capacitance data generated from the 3D transistor structures, a line can be fit to the 3D parasitic capacitance data for each different type of parasitic capacitance using the following 3D parasitic capacitance expression: $C3D_i=[A3_i*(D3_i*W+E3_i)+B3_i*NumCo]*C2D_i(L)/C2D_i(Lnom)$. Within this expression, i can be set equal to s, m, and/or mj to provide an expression for any of the different types of parasitic capacitances $C3D_s$, $C3D_m$, and $C3D_{mj}$). Within this expression, $A3_i$, $B3_i$, $C3_i$, $D3_i$, and $E3_i$ can be fitting coefficients determined by fitting a line to the three-dimensional parasitic capacitance data. The coefficients $A3_i$, $B3_i$, $C3_i$, $D3_i$, and $E3_i$ can be referred to as 3D coefficients. The term Lnom represents the nominal channel length of the 3D transistor structures. More particularly, Lnom can refer to the minimum channel length that may be used for a given fabrication technology, e.g., the technology used to implement the transistor structures in the target IC. The 3D parasitic capacitance expression, denoted as $C3D_i$, includes the 2D parasitic capacitance expression $C2D_i$.

For parasitic capacitance $C_s$, coefficients $A3_s$, $B3_s$, $C3_s$, $D3_s$, and $E3_s$ of $C3D_s$ can be determined by fitting a line specified by $C3D_s$ to the 3D parasitic capacitance data for $C_s$. For parasitic capacitance $C_m$, coefficients $A3_m$, $B3_m$, $C3_m$, $D3_m$, and $E3_m$ can be determined for $C3D_m$ by fitting a line specified by $C3D_m$ to the 3D parasitic capacitance data for $C_m$. For parasitic capacitance $C_{mj}$, coefficients $A3_{mj}$, $B3_{mj}$, $C3_{mj}$, $D3_{mj}$, and $E3_{mj}$ can be determined for $C3D_{mj}$ by fitting a line specified by $C3D_{mj}$ to the 3D parasitic capacitance data for $C_{mj}$.

Figure 3:
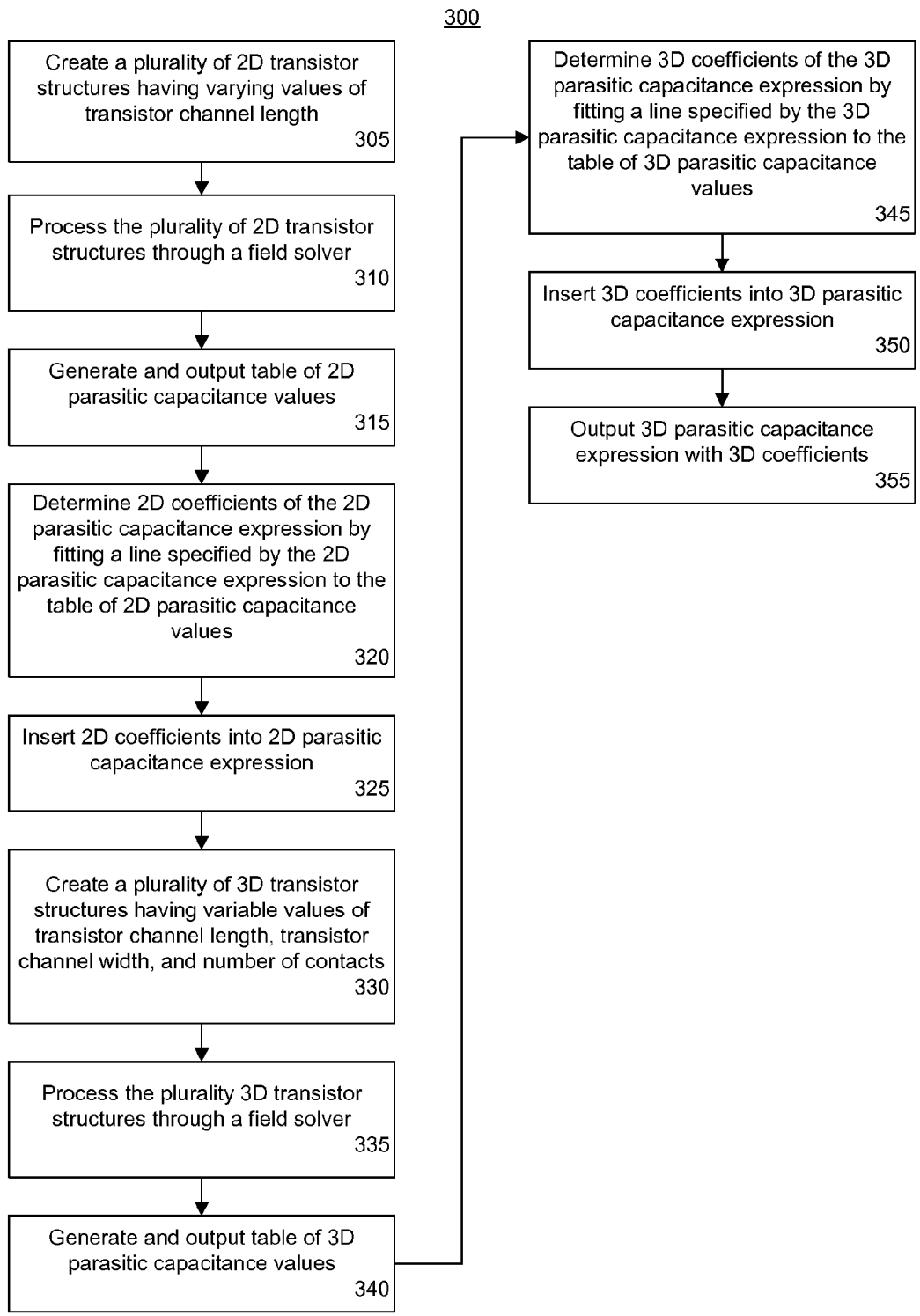
FIG. 3 is a flow chart illustrating a method of determining parasitic capacitance for a transistor structure in accordance with another embodiment of the present invention.

FIG. 3 is a flow chart illustrating a method 300 of determining parasitic capacitance for a transistor structure in accordance with another embodiment of the present invention. The method 300 can be implemented as a software-based circuit design and/or simulation application executing within a data processing system, e.g., a computer system.

Accordingly, method 300 can begin in step 305 where a plurality of 2D transistor structures, e.g., a first plurality of transistor structures, can be created. With the exception of the transistor channel length, the plurality of 2D transistor structures can have constant parameters from one transistor structure to the next. Thus, the only varying parameter between different ones of the plurality of 2D transistor structures can be transistor channel length.

In step 310, the plurality of 2D transistor structures can be processed through a field solver. The field solver can be any of a variety of commercially available field solver applications. For example, a field solver such as Raphael Interconnect Analysis Tool, which is commercially available from Synopsys, Inc. of Mountain View, Calif., can be used. Other freely available 2D and 3D field solvers may be used as well. For example, Fastcap and FFTCap, both available from Research Laboratory of Electronics at the Massachusetts Institute of Technology, are freely available solvers that may be used. Q3D Extractor is another example of a 2D and 3D solver that is available from Ansoft Corporation of Pittsburgh, Pa.

In one embodiment, the field solver may be integrated within the circuit design or simulation tool. In another embodiment, the field solver may be a standalone module that can execute cooperatively with the circuit design tool. In any case, in step 315, the field solver can generate and output a table of 2D parasitic capacitance values from the plurality of 2D transistor structures. A plurality of different values for each different type of parasitic capacitance, e.g., $C_s$, $C_m$, and $C_{mj}$, can be calculated for the different values of transistor channel length represented in the plurality of 2D transistor structures. For example, a plurality of parasitic capacitance values for different values of transistor channel length can be calculated for each of $C_s$, $C_m$, and $C_{mj}$.

In step 320, a set of 2D coefficients for the 2D parasitic capacitance expression can be determined. The set of 2D coefficients can be determined by fitting a line to the table of 2D parasitic capacitance data. In step 325, the 2D coefficients determined by fitting a line defined by the 2D parasitic capacitance expression $C2D_i$ can be inserted into the 2D parasitic capacitance expression. Step 325 can be performed for each different type of parasitic capacitance.

In step 330, a plurality of 3D transistor structures, e.g., a second plurality of transistor structures, having variable values of transistor channel length, transistor channel width, and number of contacts can be created. In step 335, the plurality of 3D transistor structures can be processed through the field solver. In step 340, the field solver can generate and output a table of 3D parasitic capacitance values from the plurality of 3D transistor structures. A plurality of different values for each different type of parasitic capacitance, e.g., $C_s$, $C_m$, and $C_{mj}$, can be calculated for different values of transistor channel length, transistor channel width, and number of contacts.

In step 345, a set of 3D coefficients for the 3D parasitic capacitance expression can be determined. The set of 3D coefficients can be determined by fitting a line defined by the 3D parasitic capacitance expression $C3D_i$ to the 3D parasitic capacitance data. In step 350, the 3D coefficients determined by fitting the line defined by $C3D_i$ to the 3D parasitic capacitance data can be inserted into the 3D parasitic capacitance expression $C3D_i$. Step 350 can be performed for each different type of parasitic capacitance.

In step 355, the 3D parasitic capacitance expression with the coefficients can be output. It should be appreciated that since the 3D parasitic capacitance expression includes the 2D parasitic capacitance expression, that both expressions along with the necessary coefficients, e.g., both 2D and 3D coefficients, can be output. The 3D parasitic capacitance expression provides a mathematical model or technique for determining parasitic capacitance of a selected type for a given transistor structure. For example, assuming constant transistor channel length and transistor channel width, the user need only specify the number of contacts NumCo for transistor structures used within a circuit design. Using the 3D parasitic capacitance expression, a measure of one or more or each different type of parasitic capacitance can be calculated for the specified transistor structure. The parasitic capacitances determined using the 3D parasitic capacitance expression can increase simulation accuracy, particularly when performing schematic simulation of a circuit design prior to layout of the circuit design on a target device or IC.

Figure 4:
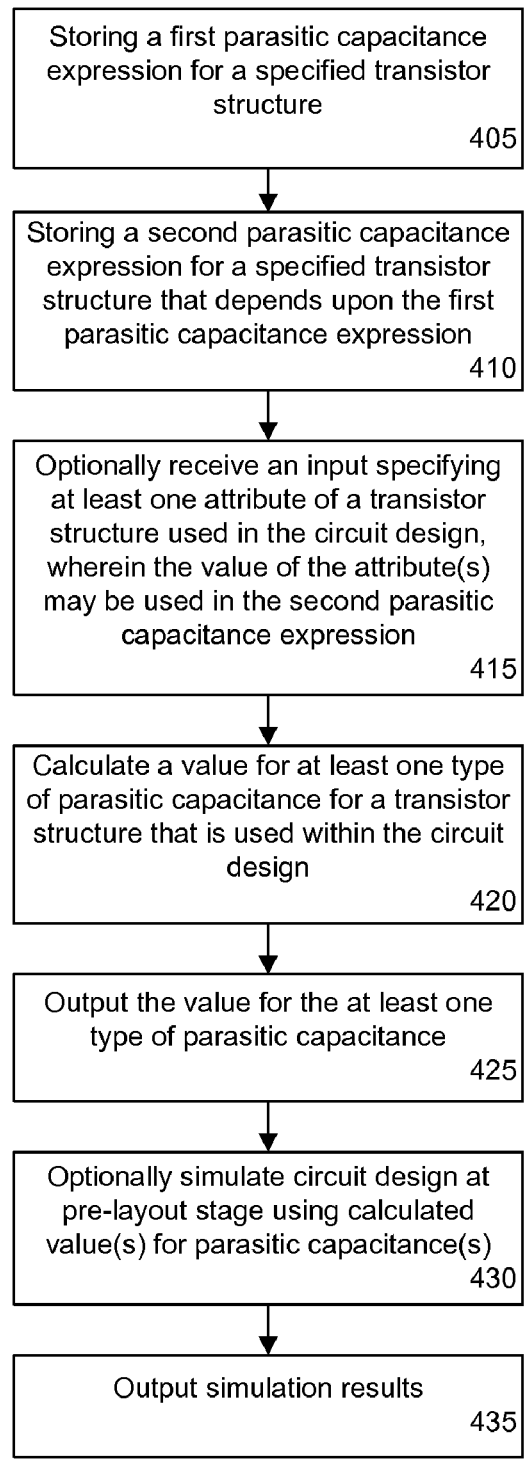
FIG. 4 is a flow chart illustrating a method of determining parasitic capacitance for a transistor structure in accordance with another embodiment of the present invention.

FIG. 4 is a flow chart illustrating a method 400 of determining parasitic capacitance for a transistor structure in accordance with another embodiment of the present invention. The method 400 can be implemented as a software-based circuit design and/or simulation application executing within a data processing system such as a computer system. For example, the method 400 can be used in the context of simulating a circuit design that is to be implemented within an IC. Accordingly, the various expressions described within this specification can have values for attributes, e.g., transistor channel length L, transistor channel width W, and/or number of contacts NumCo, that coincide to the attributes of transistor structures to be used in implementing the circuit design within the IC.

In step 405, a first parasitic capacitance expression can be stored in memory, whether a persistent or non-persistent memory. The first parasitic capacitance expression can be the 2D parasitic capacitance expression. The first parasitic capacitance expression can be stored with predetermined values for coefficients corresponding each different type of parasitic capacitance to be calculated. Each set of coefficients for the 2D parasitic capacitance expression can be determined as described within this specification.

In one embodiment, the value for transistor channel length can be stored as a constant according to the transistor channel length of transistor structures to be used in the circuit design. In another embodiment, the value for the transistor channel length can be received from a user as an input and then stored with the first expression.

In step 410, a second parasitic capacitance expression can be stored in memory. The second parasitic capacitance expression can be the 3D parasitic capacitance expression. The second parasitic capacitance expression can be stored with predetermined values for coefficients corresponding to each type of parasitic capacitance to be calculated. Each set of coefficients for the 3D parasitic capacitance expression can be determined as described within this specification.

In one embodiment, the values for transistor channel width and number of contacts can be stored as constants for the particular type of transistor structure that is to be used within the circuit design. In another embodiment, the value for the transistor channel width, the value for the number of contacts, or both can be received from a user as input(s) and then stored with the expression. The transistor channel length can be the same as that specified with respect to the first parasitic capacitance expression.

In step 415, an input from a user optionally can be received that specifies at least one attribute of a transistor structure to be used in the circuit design. The value received for the attribute may be incorporated within, or used by, the second parasitic capacitance expression. For example, as noted, the value of the attribute received can specify transistor channel length, transistor channel width, number of contacts, or any combination thereof. Alternatively, such values may be pre-programmed into the circuit design tool and be specified according to the different types of ICs that may be selected by the circuit designer. That is, by selecting a particular target IC in which the circuit design will be implemented, the attributes of the transistor structure(s) available within that IC are then known or specified.

In step 420, a value for at least one type of parasitic capacitance for the transistor structure to be used in the circuit design can be calculated. Values for $C3D_s$, $C3D_m$, $C3D_{mj}$, each, or any combination thereof, can be calculated using the second parasitic capacitance expression. As noted, the second parasitic capacitance expression includes the first parasitic capacitance expression. Accordingly, both expressions are used in calculating the second parasitic capacitance expression. In step 425, the value for each type of parasitic capacitance calculated in step 420 can be output. As used herein, "outputting" and/or "output" can mean, for example, writing to a file, writing to a user display or other output device, storing in memory, playing audible notifications, sending or transmitting to another system, exporting, or the like.

It should be appreciated that if different transistor structures are utilized in the circuit design, then parasitic capacitance values for each different transistor structure can be computed using the parasitic capacitance expressions described in this specification, albeit with different and appropriate values for transistor channel length, transistor channel width, and/or number of contacts.

In step 430, the circuit design optionally may be simulated using the parasitic capacitance values for the transistor structure, or structures, to be used within the circuit design. As noted, the values of the different types of parasitic capacitances calculated as described herein provide increased accuracy so that performance data generated from simulating the circuit design schematic, without first laying out the circuit design on the target IC, will correspond to, or closely approximate, results obtained from simulating the circuit design post-layout. In step 435, the simulation results can be output.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

A data processing system, e.g., a computer or computer system, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices such as, for example, keyboards, displays, pointing devices, etc., can be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system. Other examples of a computer program can include a programmatic representation or model of a transistor structure as described herein, a SPICE model, and/or a simulator that executes models such as SPICE models.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of determining parasitic capacitance for a transistor within an integrated circuit, the method comprising:

selecting a first expression to be $C2D_i = A2_i + B2_i/L + C2_i/(L^2)$, wherein $C2D_i$ represents a two-dimensional parasitic capacitance, wherein $A2_i$, $B2_i$, and $C2_i$ are fitting coefficients determined by fitting a line to a first plurality of parasitic capacitances, and L represents transistor channel length of a plurality of two-dimensional transistor structures;

determining, using a processor, a first set of coefficients for the first expression that calculates parasitic capacitance for a transistor structure according to the first plurality of parasitic capacitances derived from the plurality of two-dimensional transistor structures;

inserting the first set of coefficients into the first expression;

determining a second set of coefficients for a second expression that calculates parasitic capacitance for a transistor structure according to a second plurality of parasitic capacitances derived from a plurality of three-dimensional transistor structures, wherein the second expression comprises the first expression;

inserting the second set of coefficients into the second expression; and solving the second expression to determine parasitic capacitance of the transistor.

2. The computer-implemented method of claim 1, further comprising selecting the parasitic capacitance to be gate-to-source capacitance and gate-to-drain capacitance.

3. The computer-implemented method of claim 1, further comprising selecting the parasitic capacitance to be source-to-drain capacitance.

4. The computer-implemented method of claim 1, further comprising selecting the parasitic capacitance to be source metallization layer to neighboring metallization layer capacitance and drain metallization layer to neighboring metallization layer capacitance.

5. The computer-implemented method of claim 1, further comprising selecting the first expression to depend upon transistor channel length of each of the plurality of two-dimensional transistor structures.

6. The computer-implemented method of claim 1, further comprising selecting the second expression to depend upon a number of contacts of each of the plurality of three-dimensional transistor structures.

7. The computer-implemented method of claim 1, further comprising selecting the second expression to depend upon transistor channel width of each of the plurality of three-dimensional transistor structures.

8. The computer-implemented method of claim 1, further comprising selecting the second expression to depend upon transistor channel length of each of the plurality of three-dimensional transistor structures.

9. The computer-implemented method of claim 1, further comprising selecting the second expression to depend upon a nominal length of each of the plurality of three-dimensional transistor structures.

10. The computer-implemented method of claim 1, further comprising selecting the second expression to be $C3D_i = [A3_i*(D3_i*W+E3_i)+B3_i*NumCo]*C2D_i(L)/C2D_i(Lnom)$, wherein $C3D_i$ represents a three-dimensional parasitic capacitance, wherein $A3_i$, $B3_i$, $C3_i$, $D3_i$, and $E3_i$ are fitting coefficients determined by fitting a line to the second plurality of parasitic capacitances, wherein L represents transistor channel length of the plurality of three-dimensional transistor structures, Lnom represents nominal channel length of the plurality of three-dimensional transistor structures, and W represents transistor channel width of the plurality of three-dimensional transistor structures.

11. The computer-implemented method of claim 1, wherein the second expression depends upon a number of contacts, the method further comprising calculating a parasitic capacitance for a selected transistor structure having a specified number of contacts using the second expression.

12. A computer-implemented method of determining parasitic capacitance for a transistor structure within an integrated circuit, the method comprising:

defining a first expression to be $C2D_i = A2_i + B2_i/L + C2_i/(L^2)$, wherein $C2D_i$ represents a two-dimensional parasitic capacitance, wherein $A2_i$, $B2_i$, and $C2_i$ are fitting coefficients determined by fitting a first line to a first plurality of parasitic capacitances generated from a plurality of two-dimensional transistor structures, and L represents transistor channel length of a plurality of two-dimensional transistor structures;

storing the first expression;

storing a second expression that determines parasitic capacitance for transistor structures, wherein the second expression comprises the first expression and depends upon number of contacts of the transistor structures;

receiving an input specifying a number of contacts for transistor structures used within a circuit design;

calculating, using a processor, a value of parasitic capacitance for transistor structures using the second expression; and outputting the value of parasitic capacitance.

13. The computer-implemented method of claim 12, further comprising selecting the first expression to comprise a first plurality of coefficients determined from a plurality of parasitic capacitances derived from a plurality of two-dimensional transistor structures.

14. The computer-implemented method of claim 13, further comprising selecting the second expression to comprise a second plurality of coefficients determined from a second plurality of parasitic capacitances derived from a plurality of three-dimensional transistor structures.

15. The computer-implemented method of claim 12, further comprising defining the second expression to be $C3D_i = [A3_i*(D3_i*W+E3_i)+B3_i*NumCo]*C2D_i(L)/C2D_i(Lnom)$, wherein $C3D_i$ represents a three-dimensional parasitic capacitance, wherein $A3_i$, $B3_i$, $C3_i$, $D3_i$, and $E3_i$ are fitting coefficients determined by fitting a second line to a second plurality of parasitic capacitances generated from a plurality of three-dimensional transistor structures, wherein L represents transistor channel length of the plurality of three-dimensional transistor structures, Lnom represents nominal channel length of the plurality of three-dimensional transistor structures, and W represents transistor channel width of the plurality of three-dimensional transistor structures.

16. A computer program product comprising:

a non-transitory computer-usable medium comprising computer-usable program code that determines parasitic capacitance for a transistor structure within an integrated circuit, the computer-usable medium comprising:

defining a first expression to be $C2D_i = A2_i + B2_i/L + C2_i/(L^2)$, wherein $C2D_i$ represents a two-dimensional parasitic capacitance, wherein $A2_i$, $B2_i$, and $C2_i$ are fitting coefficients determined by fitting a first line to a first plurality of parasitic capacitances generated from a plurality of two-dimensional transistor structures, and L represents transistor channel length of a plurality of two-dimensional transistor structures:

computer-usable program code that stores the first expression;

computer-usable program code that stores a second expression that determines parasitic capacitance for transistor structures, wherein the second expression comprises the first expression and depends upon number of contacts of the transistor structures;

computer-usable program code that receives an input specifying a number of contacts for transistor structures used within a circuit design;

computer-usable program code that calculates a value of parasitic capacitance for transistor structures using the second expression; and computer-usable program code that outputs the value of parasitic capacitance.

17. The computer program product of claim 16, further comprising computer-usable program code that selects the second expression to comprise a second plurality of coefficients determined from a second plurality of parasitic capacitances derived from a plurality of three-dimensional transistor structures.

* * * * *